(12) United States Patent
Chien et al.

(10) Patent No.: US 11,862,637 B2
(45) Date of Patent: Jan. 2, 2024

(54) TIE OFF DEVICE

(71) Applicant: Taiwan Semiconductor Manufacturing Company, Ltd., Hsinchu (TW)

(72) Inventors: Shao-Lun Chien, Hsinchu (TW); Ting-Wei Chiang, New Taipei (TW); Hui-Zhong Zhuang, Kaohsiung (TW); Pin-Dai Sue, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/879,166

(22) Filed: May 20, 2020

(65) Prior Publication Data
US 2020/0402979 A1 Dec. 24, 2020

Related U.S. Application Data

(60) Provisional application No. 62/863,387, filed on Jun. 19, 2019.

(51) Int. Cl.
*H01L 27/092* (2006.01)
*H01L 27/088* (2006.01)
(Continued)

(52) U.S. Cl.
CPC ........ *H01L 27/0924* (2013.01); *H01L 21/765* (2013.01); *H01L 21/823412* (2013.01);
(Continued)

(58) Field of Classification Search
CPC . H01L 27/0924; H01L 27/088; H01L 27/092; H01L 27/0886; H01L 21/823878; H01L 21/765; H01L 21/823871; H01L 21/823828; H01L 21/823475; H01L 2027/11831; H01L 21/823412;
(Continued)

(56) References Cited

U.S. PATENT DOCUMENTS

| 5,821,600 A | 10/1998 | Chan |
| 8,937,358 B2 | 1/2015 | Yang et al. |

(Continued)

FOREIGN PATENT DOCUMENTS

| KR | 20140107090 A | 9/2014 |
| KR | 10-2016-0031401 A | 3/2016 |

(Continued)

*Primary Examiner* — Michael M Trinh
(74) *Attorney, Agent, or Firm* — MERCHANT & GOULD P.C.

(57) ABSTRACT

An integrated circuit device includes a first power rail, a first active area extending in a first direction, and a plurality of gates contacting the first active area and extending in a second direction perpendicular to the first direction. A first transistor includes the first active area and a first one of the gates. The first transistor has a first threshold voltage (VT). A second transistor includes the first active area and a second one of the gates. The second transistor has a second VT different than the first VT. A tie-off transistor is positioned (Continued)

between the first transistor and the second transistor, and includes the first active area and a third one of the gates, wherein the third gate is connected to the first power rail.

20 Claims, 9 Drawing Sheets

(51) Int. Cl.
  *H01L 21/8234* (2006.01)
  *H01L 23/528* (2006.01)
  *H01L 23/522* (2006.01)
  *H01L 21/765* (2006.01)
  *H01L 21/8238* (2006.01)
(52) U.S. Cl.
  CPC ............ *H01L 21/823821* (2013.01); *H01L 21/823828* (2013.01); *H01L 21/823871* (2013.01); *H01L 21/823878* (2013.01); *H01L 23/5226* (2013.01); *H01L 23/5286* (2013.01); *H01L 27/088* (2013.01); *H01L 27/092* (2013.01); *H01L 27/0922* (2013.01)
(58) Field of Classification Search
  CPC ............ H01L 27/0922; H01L 27/0207; H01L 23/5286; H01L 23/5226
  See application file for complete search history.

(56) References Cited

U.S. PATENT DOCUMENTS

| | | | |
|---|---|---|---|
| 9,009,641 B2 | 4/2015 | Becker et al. | |
| 9,337,109 B2 | 5/2016 | Doornbos et al. | |
| 10,236,302 B2 | 3/2019 | Correale, Jr. et al. | |
| 10,276,575 B2 | 4/2019 | Walke et al. | |
| 10,361,198 B2 | 7/2019 | Rastogi et al. | |
| 2014/0001563 A1* | 1/2014 | Rashed | H01L 27/0207 257/369 |
| 2016/0078164 A1* | 3/2016 | Hsieh | H01L 27/0207 716/55 |
| 2016/0336183 A1* | 11/2016 | Yuan | H01L 21/76895 |
| 2017/0263506 A1 | 9/2017 | Bouche et al. | |
| 2017/0323902 A1* | 11/2017 | Zeng | H01L 23/485 |
| 2017/0358584 A1* | 12/2017 | Wang | H10B 12/36 |
| 2017/0373090 A1 | 12/2017 | Correale, Jr. et al. | |
| 2019/0123140 A1 | 4/2019 | Park et al. | |
| 2019/0237542 A1* | 8/2019 | Chen | H01L 29/0642 |

FOREIGN PATENT DOCUMENTS

| | | |
|---|---|---|
| KR | 20180038239 A | 4/2018 |
| KR | 20180101698 A | 9/2018 |
| KR | 20190020682 A | 3/2019 |
| KR | 10-2019-0043777 A | 4/2019 |
| TW | 201610734 A | 3/2016 |

\* cited by examiner

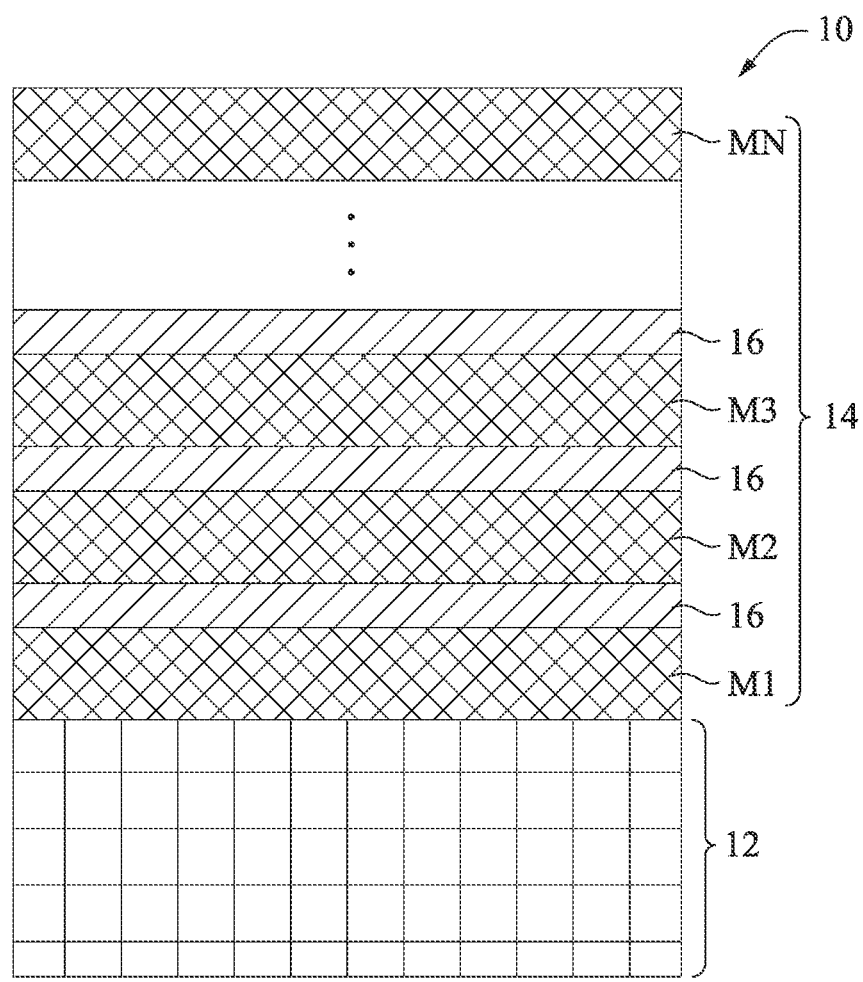
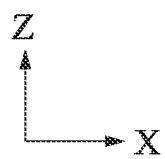
FIG. 1

TIE OFF DEVICE

CROSS-REFERENCE

This application claims the benefit of U.S. Provisional Application No. 62/863,387, filed on Jun. 19, 2019, which is incorporated by reference in its entirety.

BACKGROUND

Vertical semiconductor devices, such as fin-based metal-oxide-semiconductor field-effect transistors (FinFET), are three-dimensional structures on the surface of a semiconductor substrate. Fins extend upwards from the body of the substrate, and may be formed by depositing fin material on the substrate, etching non-fin areas of the substrate, or a combination thereof. The channel of the FET is formed in this vertical fin, and a gate is provided over (e.g., wrapping) the fin. Wrapping the gate around the fin increases the contact area between the channel region and the gate and allows the gate to control the channel from both sides. As integrated circuit devices get smaller, spacing or "pitch" between devices may result in electromagnetic interference among adjacent devices.

Adjacent devices, such as FinFETs, may be electrically isolated, where an adjacent transistor may be used as an isolation device. Such an isolation device may be referred to as a "tie-off" device in which the active area of the tie-off device is set to an off state. A gate of an isolation device (a "tie-off gate") may be biased to place the isolation device in an OFF state and provide isolation for an adjacent active device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 1 is a block diagram illustrating an example of a semiconductor device in accordance with some embodiments.

DETAILED DESCRIPTION

Figure 2:
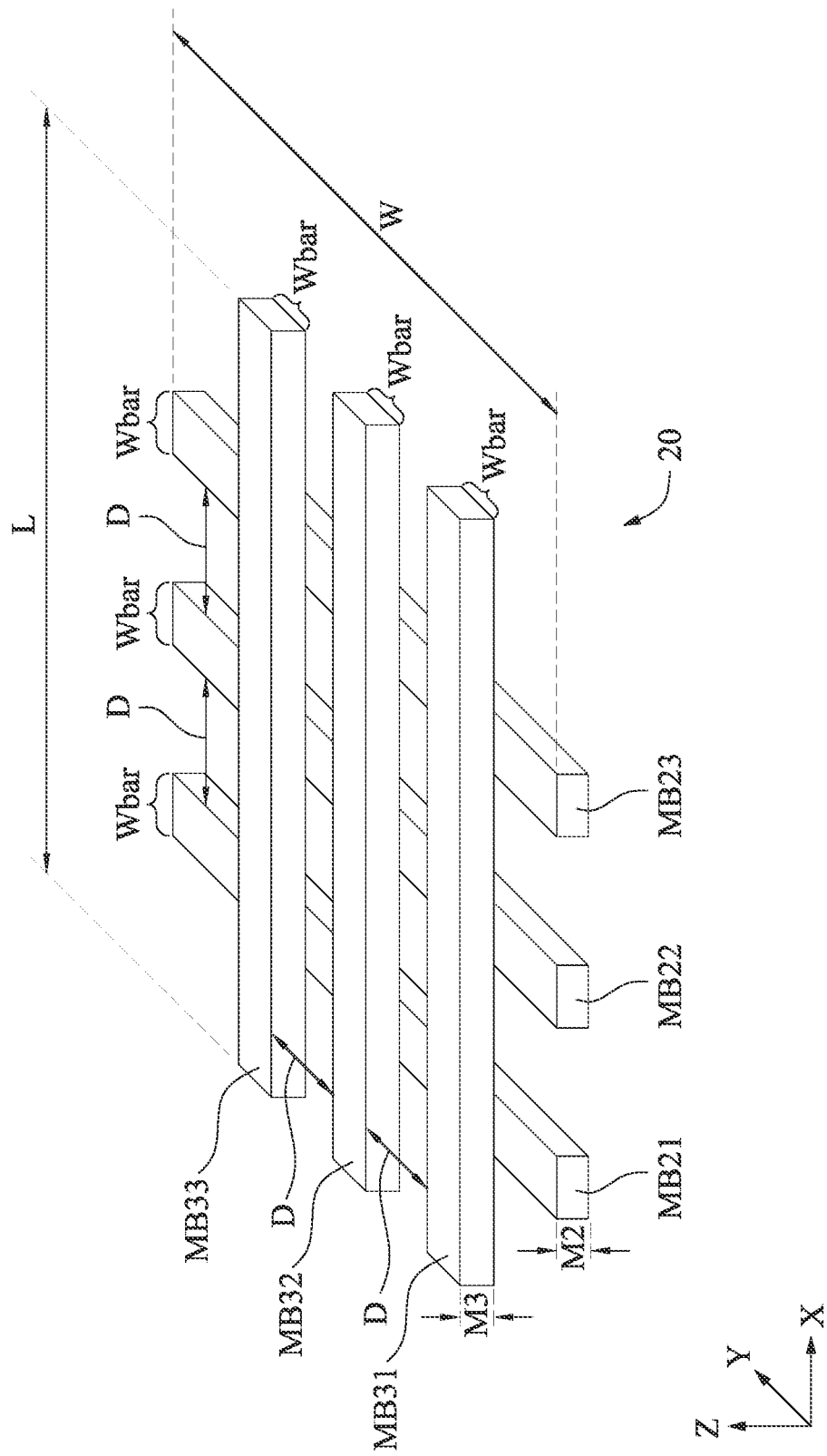
FIG. 2 is a block diagram illustrating example metal layers of the semiconductor device shown in FIG. 1 in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multi-threshold voltage IC devices are sometimes used to optimize delay or power in various circuits and devices. A multi-threshold voltage IC device may include several different devices, each having a different threshold voltage (i.e., operating voltage). For example, the multi-threshold voltage IC device may include two or more of a low threshold voltage (LVT) device, a standard threshold voltage (SVT) device and a high threshold voltage (HVT) device.

Adjacent devices, including adjacent multi-threshold IC devices such as multi-threshold FinFETs, may be electrically isolated using one or more isolation devices. Such an isolation device may be referred to as a "tie-off" device. In some examples, a transistor is configured as an isolation device, where the active area of the tie-off device is set to an off state. A gate of an isolation device (a "tie-off gate") may be biased to place the isolation device in an off state and provide isolation for an adjacent active device. For instance, a tie-off device may be situated at a threshold voltage (VT) boundary between devices.

In accordance with some disclosed embodiments, a poly gate for a tie-off transistor is positioned at VT boundary of mixed VT structure. The transistor may be tied off by a conductive via connecting the poly gate to a power rail maintain the device in an off state. Positioning the poly gate at the VT boundary and directly connecting the poly gate to the power rail by the via may save device area.

FIG. 1 is a block diagram illustrating a cross-section of an example semiconductor structure 10 in accordance with some embodiments. The structure 10 is shown in the X-axis and Z-axis directions in FIG. 1, while the Y-axis direction is orthogonal to the plane of the cross-section illustrated in FIG. 1. The structure 10 includes a base layer 12 and an interconnect layer 14.

Generally, the base layer 12 includes a semiconductor substrate that, in turn, includes polysilicon regions (also termed "poly" throughout this disclosure), diffusion regions, semiconductor wells (e.g., N-wells, P-wells, deep N-wells, deep P-wells), etc., wherein semiconductor devices (e.g., transistors, diodes, etc.) are formed. The interconnect layer 14 includes N (e.g., an integer number of) conductive layers (e.g., metal layers M1 to MN) used for interconnecting devices within layers in interconnect layer 120 and for forming electrical connections to external devices, etc. The interconnect layer 14 generally includes vias, inter-level dielectric materials, passivation layers, bonding pads, packaging resources, etc. Each metal (e.g., conductive) layer M in the interconnect layer 14 is commonly called metal one, metal two, metal three (M1, M2, M3, etc) layers, etc. Between the various metal layers M are dielectric materials (e.g., high-K, low-K material, etc.) 16 used to insulate the metal layers M. The base layer 12 and interconnect layer 14 are often called a front-end structure and a backend structure, respectively, because they are the respective "front end of line" (FEOL) and "back end of line" (BEOL) in the semiconductor fabrication process.

FIG. 2 is a block diagram illustrating an example interconnect metal layer structure 20 in accordance with some embodiments. The metal layer structure 20 includes a plurality of conductive layers M (e.g., M1, M2, M3, etc.). In the embodiment shown, the metal layer structure 20 illustrates only two layers (e.g., M2 and M3). Metal layer structures having different numbers of layers, e.g., from 1 to N layers, are within the scope of the disclosed embodiments.

In the embodiment shown in FIG. 2, each metal layer M includes a plurality of metal bars MB, for example, metal bars MB21, MB22, and MB23 in layer M2 and metal bars MB31, MB32, MB33 in layer M3. In some embodiments, the shape of the metal bars is cylindrical or some other shape, and can be any cross-sectional shape. In the embodiment shown, each of the metal bars MB in a layer M are substantially parallel to one another. In the embodiment shown, each metal layer M2 and M3 includes three metal bars MB, however, configurations having different numbers of metal bars MB per metal layer M are within the scope of the disclosed embodiments. In some embodiments, a first set of metal bars MB (e.g., metal bars MB in metal layers M1, M3, M5, etc.) run in a first direction (e.g., X-axis direction) while a second set of metal bars MB (e.g., in metal layers M2, M4, M6, etc.) run in a second direction (e.g., Y-axis direction) wherein the X-axis direction is perpendicular to the Y-axis direction. Different configurations wherein all bars MB run in one direction, e.g., X-axis direction, Y-axis direction, or any other convenient direction, or a combination of directions, including non-perpendicular directions, are within the scope of the disclosed embodiments. In the embodiment shown in FIG. 2, each metal bar MB has a width Wbar. In some embodiments, all widths Wbar are of the same dimension, but the disclosed embodiments are not limited to such a configuration. Depending on design choices, the widths Wbar may be of different dimensions (e.g., one width Wbar may be shorter/larger than another one). Two adjacent metal bars MB are spaced or separated by a distance, e.g., distance D. In some embodiments, distances D are selected to meet the minimum requirements of spacing between two metal bars MB to form capacitance between those two bars. In some embodiments, all distances D in the metal layer structure 20 are of the same dimension, but the disclosed embodiments are not limited to such a configuration. That is, distances D may be of different dimensions (e.g., one distance D may be shorter/longer than another one). The thickness of a metal bar MB in a layer M is proportional to the layer M thickness, which can be process technology dependent, and different groups of layers M can have different thicknesses. For example, a first group of metal layers M (e.g., Mx) can have a first thickness, a second group of metal layer M (e.g., My) can have a second thickness, and a third group of metal layers (e.g., Mz) can have a third thickness, etc, wherein the first, the second, and the third thickness are different. In the embodiment shown, the metal layer structure 20 has a width W and a length L.

Figure 3:
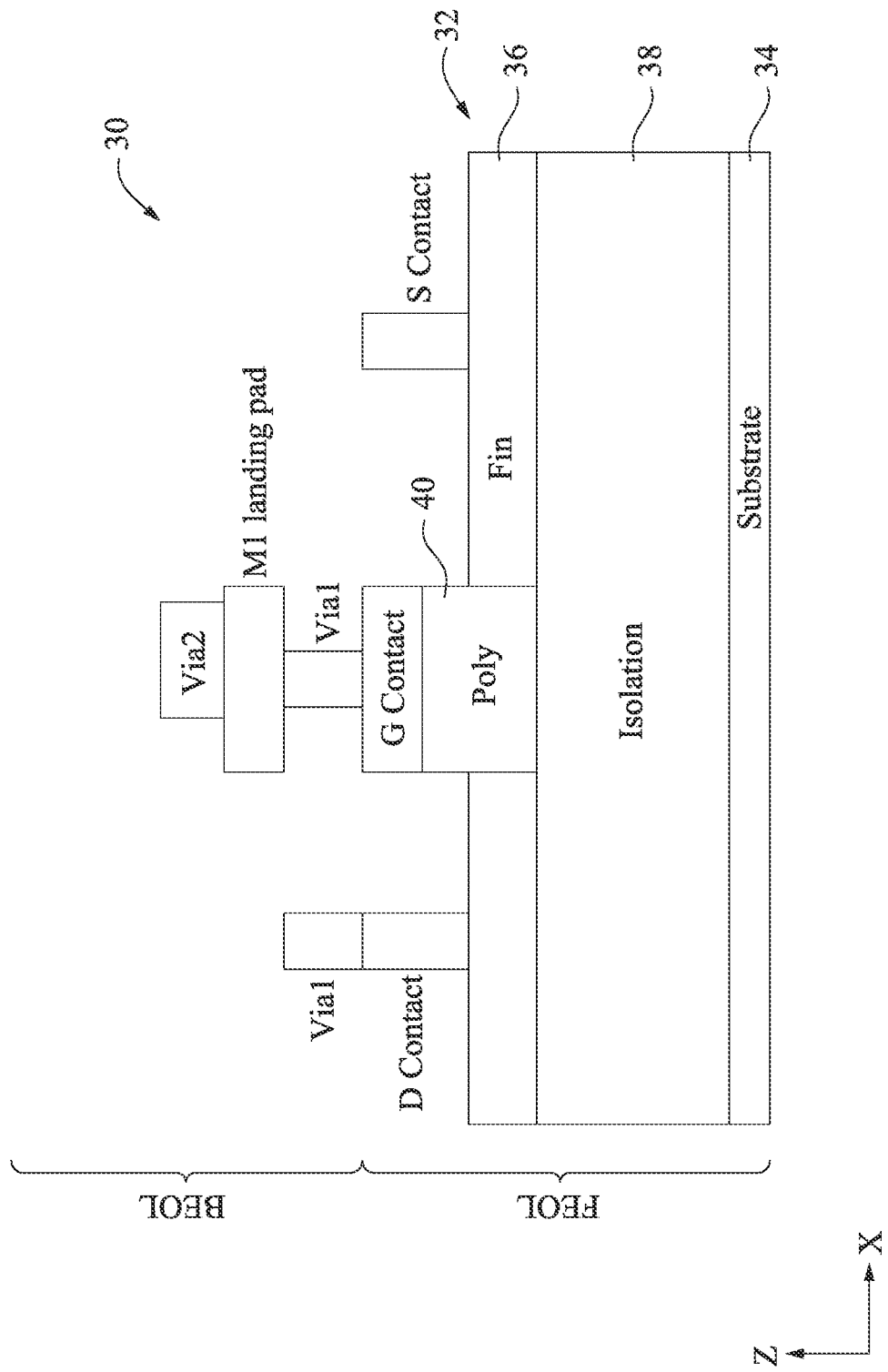
FIG. 3 is a block diagram illustrating an example FinFET device in accordance with some embodiments.

FIG. 3 is a block diagram illustrating a cross-section of an example semiconductor structure 30 in accordance with some embodiments. The embodiment shown includes a FEOL layer including semiconductor structures and a BEOL layer including interconnect metal layer structures.

In the embodiment shown, the FEOL layer includes a FinFET transistor 32. The FinFET transistor 32 includes a semiconductor substrate 34, a fin 36, an isolation region 38, a polysilicon structure, e.g. poly 40, the conductive contacts S and D connected to the fin, and the conductive contact G connected to the poly 40. In the embodiment shown, the conduction path for current is the fin 36 (the fin can also be referred to as an active area or region). The poly 40 functions as a gate allowing current flow in the fin from the S (e.g. source) contact to the D (e.g. drain) contact. In general, such a gate structure includes one or more conductive segments including one or more conductive materials such as the poly noted above. Other gate materials could include one or more metals, doped polysilicon, and/or other conductive materials. The conductive segments are thus configured to control a voltage provided to an underlying dielectric layer. In various embodiments, the gate dielectric layer includes, for example, one or more of silicon dioxide and/or a high-k dielectric material, e.g., a dielectric material having a k value higher than 3.8 or 7.0. In some embodiments, a high-k dielectric material includes aluminum oxide, hafnium oxide, lanthanum oxide, or another suitable material. For example, for a voltage potential between the S and D contacts, current can flow in the fin from S to D depending on a voltage applied to the poly 40. If a voltage less than a threshold voltage (VT) is applied to the poly 40, then appreciable current cannot flow in the fin from the S to the D contacts, and the transistor 32 is "off." If a voltage greater than or equal to the VT is applied to the poly 40, appreciable current flows from S to D via the fin and the transistor 32 is "on." In some embodiments, the S, D, and G contacts form connections between multiple fins and polys in the FEOL layer, thereby connecting the sources, drains, and gates of one or more transistors. In some embodiments, the sources, drains, and gates of the transistor 32 are connected to an interconnect metal layer structure in the BEOL layer. For example, the gate of the transistor 32 may be connected to other structures by one or more of the metal bars in one of the layers of the interconnect metal structure in the BEOL layer, and the S/D contacts of the transistor 32 may be similarly be connected to other structures using other ones of the metal bars in one or more of the metal layers in the BEOL layer. In some embodiments, the BEOL layer serves to connect the transistor 32 to peripheral circuits. In the embodiment shown, the D, and G contacts connect to the metal bars in the BEOL layer using vias. For example, Via1 forms a connection between the D contact to a metal bar in the first metal layer M1 above the FEOL layer. In the embodiment shown, a separate Via1 connects the G contact to a conductive landing pad in the M1 layer, and Via2 connects the conductive landing pad to a metal bar in the M2 layer.

Figure 4:
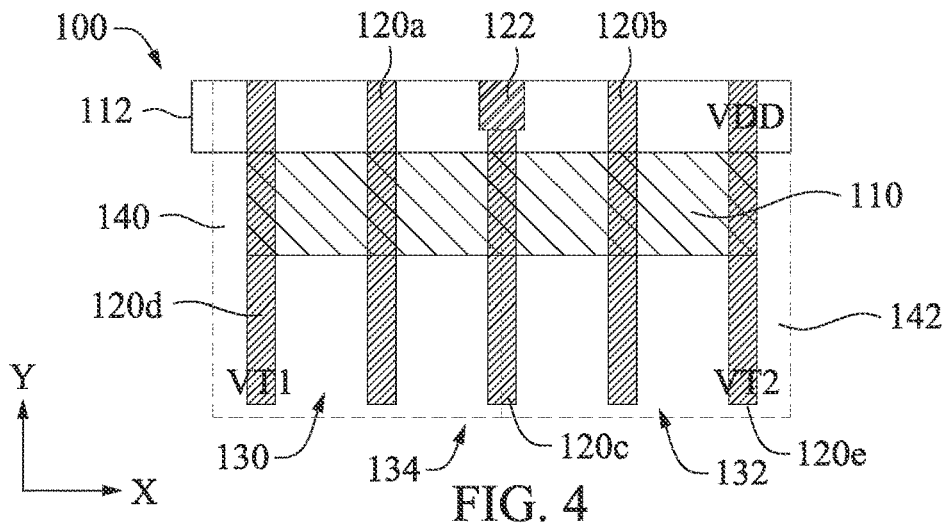
FIG. 4 is a block diagram illustrating an example semiconductor device in accordance with some embodiments.

FIG. 4 illustrates an example of an integrated circuit device 100 in accordance with disclosed aspects. In general, the device 100 may include FinFET structures such as those shown in FIGS. 1-3. The device 100 shown in FIG. 4 includes a first power rail 112, such as a VDD or VSS power rail. In the example of FIG. 4, the power rail 112 is the VDD rail. A first active area 110 extends in the X-axis direction. In some examples, the active area 110 include a fin such as the fin 36 shown in FIG. 3. A plurality of poly gates 120 contact the active area 110 and extend in the Y-axis direction. In other words, the poly gates 120 extend generally perpendicular to the active area 110. In the example illustrated in FIG. 4, the plurality of poly gates 120 includes five poly gates labeled 120a-120e.

A first transistor 130 is formed by the first active area 110 and a first one of the poly gates 120a, and a second transistor 132 is formed by the first active area 110 and a second one of the poly gates 120b. In the illustrated example, the first transistor 130 has a first VT, and the second transistor 132 has a second VT different than the first VT. The device 100 thus includes a continuous active area 110 that defines two different VT levels. In the illustrated embodiment, the active area 110 includes a first VT region 140 and a second VT region 142. For example, the first and second VTs could be any of a standard VT (SVT), low VT (LVT), ultra low VT (uLVT), high VT (HVT), etc. Thus, for example, the first transistor 130 may have a standard VT (SVT) and the second transistor 132 may have a low VT (LVT).

Multiple VT devices may achieve a better power efficiency in some IC devices. In some examples, the active area 110 is fabricated to have different VT characteristics by using channel and/or halo implantation optimization. For example, a HVT device may be achieved by heavily implanting the device channel/halo pockets including ion implantation and a thermal anneal.

A tie-off transistor 134 is positioned between the first transistor 130 and the second transistor 134. The tie-off transistor 134 is formed by the first active area 110 and a third one of the poly gates 120c. The third poly gate 120c of the tie-off transistor 134 is connected to the power rail 112 maintain the tie-off transistor in an off state. The tie-off transistor 134 is configured to electrically isolate the first transistor 130 having the first VT from the second transistor 132 having the second TV. In the example illustrated in FIG. 1, the first and second transistors 130, 132 and the tie-off transistor 134 are PMOS transistors. The PMOS tie-off transistor 134 has its poly gate 120c connected to the VDD power rail 112 by a conductive via 122 to keep the tie-off transistor 134 off to electrically isolate the first transistor 130 from the second transistor 132.

In some examples, the tie-off transistor 134 may be situated at the boundary of the first and second VT regions 140, 142. As such, the poly gate 120c that connects the tie-off transistor 134 to the VDD rail 112 extends along the Y-axis direction directly over the VT boundary. Connecting the tie-off transistor to the power rail 112 using the poly gate 120c saves area as compared to using a metal line for the tie-off device.

In the example of FIG. 4, the poly gates 120d and 120e may be continuous poly on oxide definition edge (CPODE) patterns. In some implementations, an IC device such as a metal-oxide-semiconductor field-effect transistor (MOSFET) is scaled down through various technology nodes, device packing density and device performance are challenged by device layout and isolation. In order to avoid leakage between neighboring devices, poly segments may be formed on edges of an active region such as the fin 110 in a FinFET. Such poly segments are sometimes also referred to as a poly-on-OD-edge (PODE). The PODE helps to achieve better device performance and better poly profile control.

In some embodiments, the PODE structures are formed on the edge of the device 100, and are used to protect the ends of the fin 110 during processing. That is, the PODE polysilicon structures are not electrically connected as gates for the transistors but are instead "dummy" structures, having no function in the circuit. The PODE structures cover and protect the ends of the fin 110, providing additional reliability during processing.

In general, the number of poly gates 120 in contact with the fin 110 can be considered to be the "pitch," often termed the "contacted poly pitch" or CPP, of the IC device along one dimension. The CPP may be at least partially determinative of the density of the IC device. By positioning the poly gate 120c of the tie-off transistor 134 directly over the VT region boundary, the poly gate 120c is "shared" by both the first and second VT regions 140, 142 rather than requiring a separate poly lines for separate tie off devices in each of the first and second VT regions 140, 142. As such, one poly pitch may be eliminated in the disclosed examples, resulting in a 5 CPP device.

Figure 5:
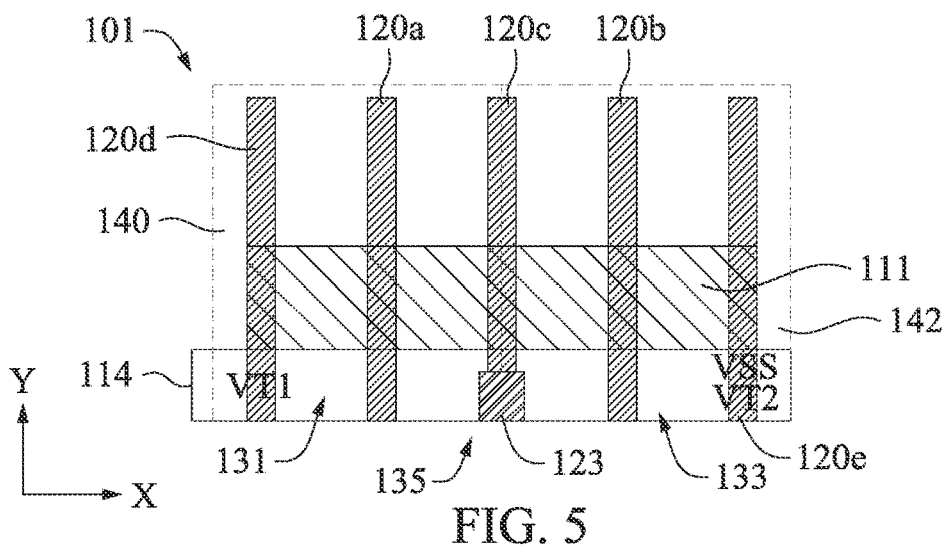
FIG. 5 is a block diagram illustrating another example semiconductor device in accordance with some embodiments.

FIG. 5 illustrates another example integrated circuit device 101 in accordance with disclosed aspects. The device 101 shown in FIG. 5 is similar to the device 100 of FIG. 4, though the device 101 includes a second power rail 114, which is the VSS power rail in the illustrated example, and rather than including PMOS transistors as in the device 100 of FIG. 4, FIG. 5 discloses NMOS transistors. As with the device 100 disclosed above, the device 101 includes an active area or fin 111 that extends in the X-axis direction. The plurality of poly gates 120 contact the active area 111 and extend in the Y-axis direction such that the poly gates 120 extend generally perpendicular to the active area 111. The plurality of poly gates 120 illustrated in FIG. 5 are again labeled 120a-120e. In other words, the device 101 is also a five CPP structure.

A first NMOS transistor 131 having the first VT is formed by the active area 111 and the first poly gate 120a, and a second NMOS transistor 133 having the second VT is formed by the active area 111 and the second poly gate 120b. The device 101 thus includes the continuous active area 111 with the first VT region 140 and the second VT region 142. As noted above, the first and second VTs could be any of a standard VT (SVT), low VT (LVT), ultra low VT (uLVT), high VT (HVT), etc.

A tie-off transistor 135 is positioned between the first NMOS transistor 131 and the second NMOS transistor 133. The tie-off transistor 135 is formed by the active area 111 and the third poly gate 120c. In the example illustrated in FIG. 5, the tie-off transistor 135 is an NMOS transistor with the poly gate 120c connected to the VSS power rail 114 by a conductive via 123 to keep the tie-off transistor 135 off to electrically isolate the first NMOS transistor 131 from the second NMOS transistor 133. The tie-off transistor 135 is situated at the boundary of the first and second VT regions 140, 142.

Figure 6:
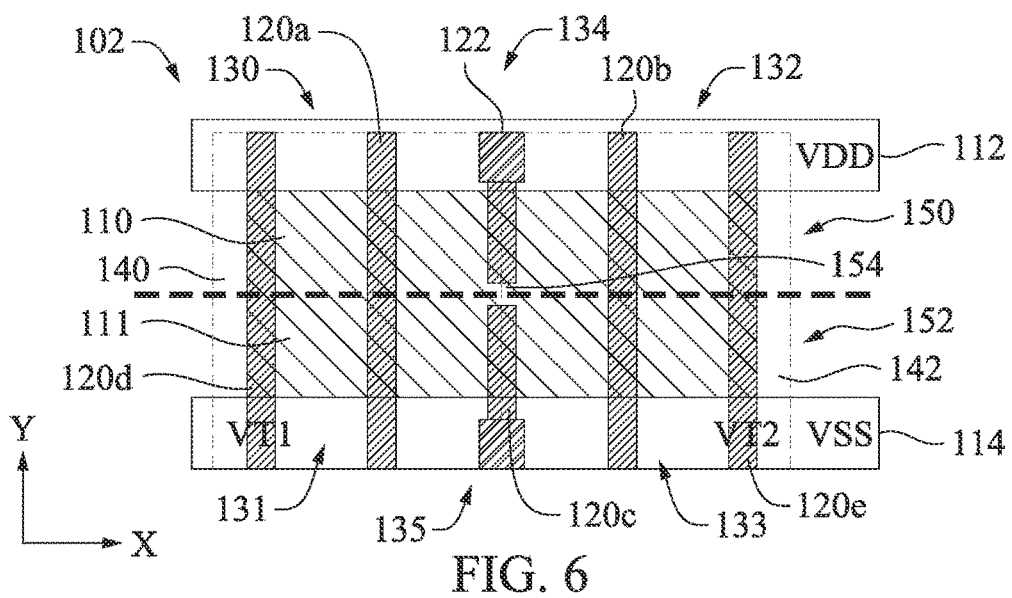
FIG. 6 is a block diagram illustrating a further example semiconductor device in accordance with some embodiments.

FIG. 6 illustrates an embodiment of an integrated circuit device 102 that includes both PMOS and NMOS transistors with tie-off transistors having poly gates coupled to the VDD and VSS power rails. As such, the device 102 includes the first and second fins 110, 111 that define a PMOS region 150 and NMOS region 152. The device 102 includes the first and second power rails 112,114, which are the VDD and VSS power rails, respectively, in the illustrated example. The active areas or fins 110 and 111 extend in the X-axis direction. The plurality of poly gates 120 contact the active area 111 and extend in the Y-axis direction such that the poly gates 120 extend generally perpendicular to the active areas 110, 111. The device 102 has five poly gates 120a-120e and is thus also a five CPP structure.

The PMOS region 150 includes the first PMOS transistor 130 formed by the first active area 110 and the first poly gate 120a, and the second PMOS transistor 132 formed by the first active area 110 and the poly gate 120b. The first NMOS transistor 131 is formed by the active area 111 and the first poly gate 120a, and the second NMOS transistor 133 is formed by the active area 111 and the second poly gate 120b. The device 102 includes the continuous active areas 110, 111 with the first VT region 140 and the second VT region 142. Accordingly, the first PMOS transistor 130 and the first NMOS transistor 131 have the first VT, while the second PMOS transistor 134 and the second NMOS transistor 135 have the second VT. As noted above, the first and second VTs could be any of a standard VT (SVT), low VT (LVT), ultra low VT (uLVT), high VT (HVT), etc.

The tie-off transistors 134 and 135 are formed by the active areas 110, 111 and the third poly gate 120c, and are positioned at the border of the first and second VT regions 140, 142. As such, the PMOS tie-off transistor 134 is positioned between the first and second PMOS transistors 130, 132, and the NMOS tie-off transistor 135 is positioned between the first and second NMOS transistors 131, 133.

In the example illustrated in FIG. 6, the tie-off transistor 134 is a PMOS transistor and the tie-off transistor 135 is an NMOS transistor. The poly gate 120c connected to the VDD power rail 112 by the conductive via 122 and to the VSS power rail 114 by the conductive via 123. The poly gate 120 is patterned or cut at a separation 154 such that the upper portion of the poly gate 120c connects the PMOS tie-off transistor 134 to the VDD rail 112, but does not connect the gate of the PMOS tie-off transistor 134 to the VSS terminal. The lower portion of the poly gate 120c connects the NMOS tie-off transistor 135 to the VSS rail 114, but does not connect the gate of the NMOS tie-off transistor 135 to the VDD terminal. In other words, the poly gate 120c does not directly connect or short the VDD rail to the VSS rail. In this manner, both tie-off transistors 134 and 135 are kept in an off state to electrically isolate the first and second PMOS transistors 130, 132 from each other, and the first and second NMOS transistors 131, 133 from each other.

Figure 7:
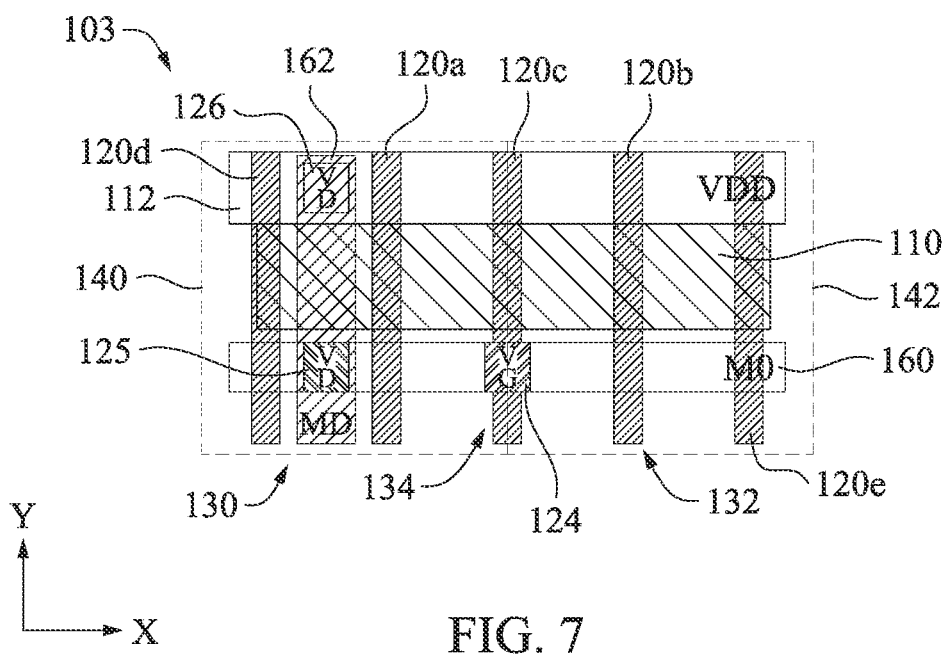
FIG. 7 is a block diagram illustrating yet another example semiconductor device in accordance with some embodiments.

In the devices 100-102 shown in FIGS. 4-6, the poly gates 120c for each of the tie-off transistors 134, 135 connect to the power rails 112 or 114 by the conductive vias 122 or 123. More particularly, the conductive vias 122 and 123 extend directly from the poly gate 120c to the respective power rails. FIG. 7 illustrates an example integrated circuit device 103 in accordance with further embodiments, where the poly gate of the tie-off transistor connects to the power rail through one or more metal connectors. The device 103 shown in FIG. 7 includes the first (VDD) power rail 112 and has PMOS transistors. The first active area or fin 110 extends in the X-axis direction, and the poly gates 120 contact the active area 110 and extend in the Y-axis direction. In the example illustrated in FIG. 7, the plurality of poly gates 120 again includes five poly gates labeled 120a-120e.

The first PMOS transistor 130 in the first VT region 140 is formed by the first active area 110 and the first poly gate 120a, and the second PMOS transistor 132 in the second VT region 142 is formed by the first active area 110 and the second poly gate 120b. Thus, the first transistor 130 has the first VT, and the second transistor 132 has the second VT different than the first VT as described above.

The PMOS tie-off transistor 134 is positioned between the first PMOS transistor 130 and the second PMOS transistor 132. The tie-off transistor 134 is formed by the first active area 110 and the poly gate 120c. The poly gate 120c of the tie-off transistor 134 is connected to the power rail 112 to maintain the tie-off transistor in an off state. More specifically, in the example shown in FIG. 7 a conductive via 124 connects the poly gate 120c to a metal conductor or metal bar in one of the metal layers 160 such as the M0 metal layer. In the illustrated example, the M0 metal layer 160 extends in the X-axis direction. The metal layer 160 is connected to a metal strip 162 (such as a metal deposit over the active area 110) by a conductive via 125, and the metal strip 162 connects to the VDD rail 112 by another conductive via 126. In the illustrated example, the metal strip 162 extends in the Y-axis direction. Thus, the poly gate 120c is connected to the VDD rail 112 by the M0 metal layer 160 and the metal strip 162 to maintain the tie-off transistor 134 in an off state for isolating the PMOS transistors 130, 132 from one another.

Figure 8:
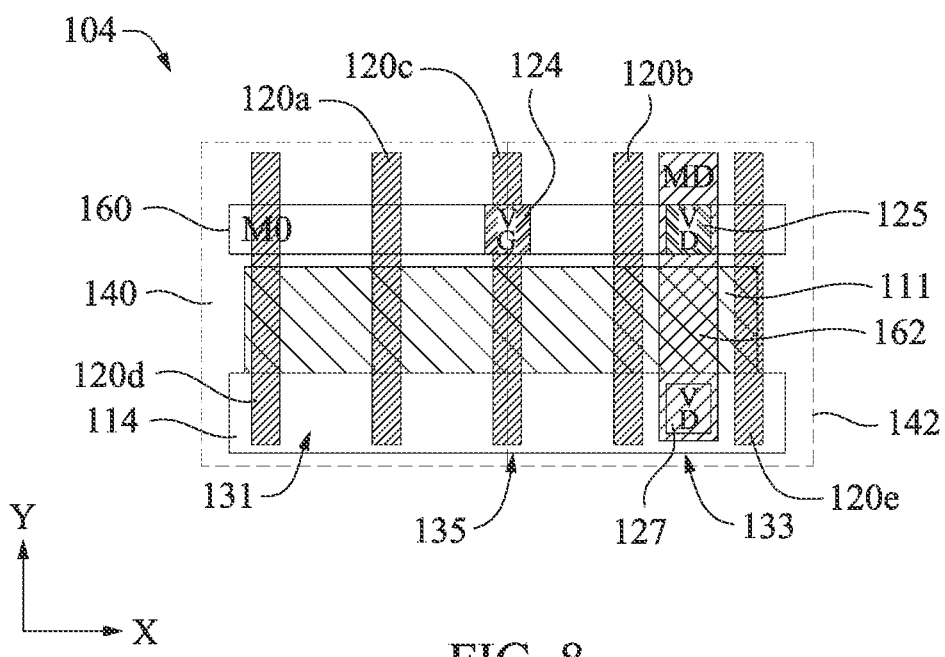
FIG. 8 is a block diagram illustrating a further example semiconductor device in accordance with some embodiments.

FIG. 8 illustrates another example where the poly gate of the tie-off transistor connects to the power rail through one or more metal connectors. The device 104 shown in FIG. 8 includes the second (VSS) power rail 114 and has NMOS transistors. The active area or fin 111 extends in the X-axis direction, and the poly gates 120 contact the active area 111 and extend in the Y-axis direction. In the example illustrated in FIG. 8, the plurality of poly gates 120 again includes five poly gates labeled 120a-120e.

The first NMOS transistor 131 in the first VT region 140 is formed by the first active area 111 and the first poly gate 120a, and the second NMOS transistor 133 in the second VT region 142 is formed by the active area 111 and the second poly gate 120b. Thus, the first NMOS transistor 131 has the first VT, and the second NMOS transistor 133 has the second VT different than the first VT as described above.

The NMOS tie-off transistor 135 is positioned between the first NMOS transistor 131 and the second NMOS transistor 133. The tie-off transistor 135 is formed by the active area 111 and the poly gate 120c, which is connected to the VSS power rail 114 to maintain the NMOS tie-off transistor 135 in an off state. More specifically, in the example shown in FIG. 8 a conductive via 124 connects the poly gate 120c to the M0 metal layer 160. The metal layer 160 is connected to a metal strip 162 (such as a metal deposit over the active area 110) by a conductive via 125, and the metal strip 162 connects to the VSS rail 114 by a conductive via 127. Thus, the poly gate 120c is connected to the VSS rail 114 by the M0 metal layer 160 and the metal strip 162 to maintain the NMOS tie-off transistor 135 in an off state for isolating the NMOS transistors 131, 133 from one another.

Figure 9:
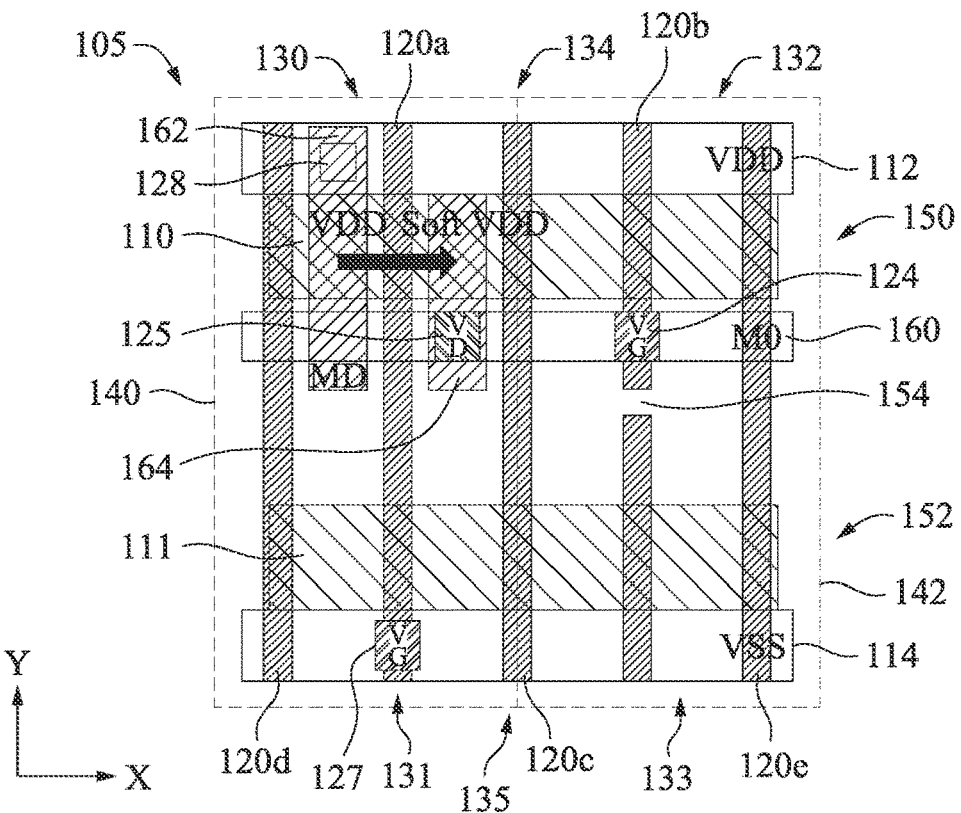
FIG. 9 is a block diagram illustrating another example semiconductor device in accordance with some embodiments.
Figure 10:
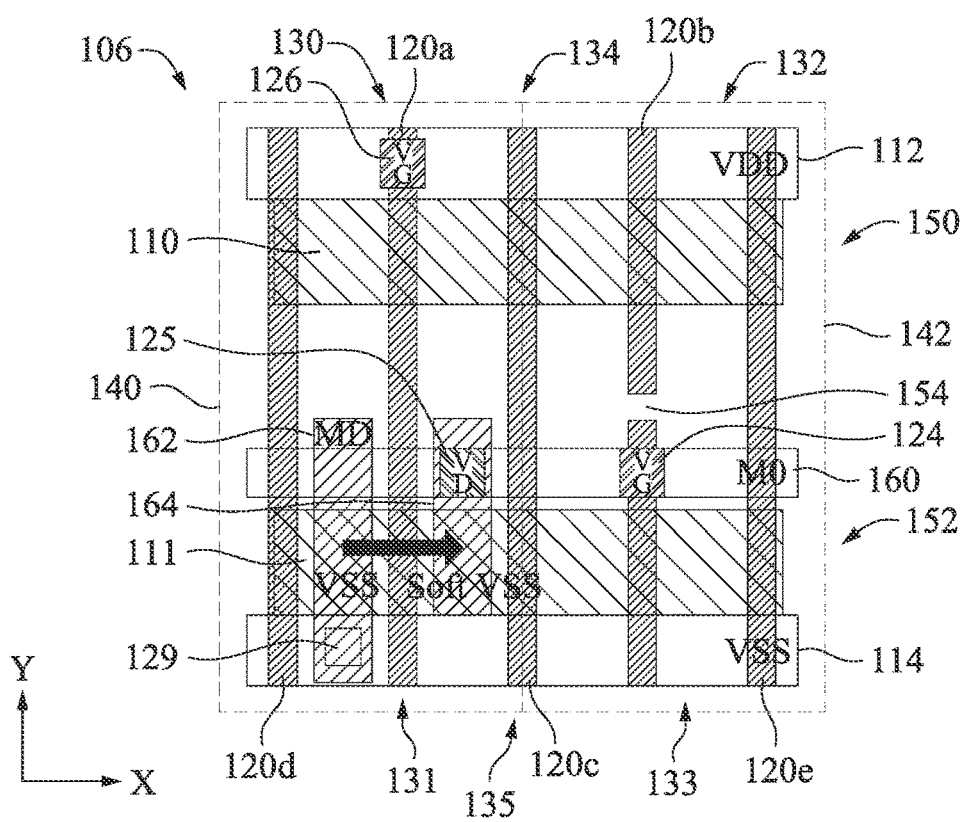
FIG. 10 is a block diagram illustrating another example semiconductor device in accordance with some embodiments.

FIGS. 9 and 10 illustrate example devices that use a "soft" connection of tie-off transistors to the appropriate power rails. For instance, FIG. 9 illustrates a device 105 that includes the first and second fins 110, 111 that define the PMOS region 150 and the NMOS region 152. The device 105 includes the first and second power rails 112,114, which are the VDD and VSS power rails, respectively, in the illustrated example. The active areas or fins 110 and 111 extend in the X-axis direction. The plurality of poly gates 120 contact the active area 111 and extend in the Y-axis direction such that the poly gates 120 extend generally perpendicular to the active areas 110, 111. The device 105 has five poly gates 120a-120e and is thus also a five CPP structure.

The PMOS region 150 includes the first PMOS transistor 130 formed by the first active area 110 and the first poly gate 120a, and the second PMOS transistor 132 formed by the first active area 110 and the poly gate 120b. The first NMOS transistor 131 is formed by the active area 111 and the first poly gate 120a, and the second NMOS transistor 133 is formed by the active area 111 and the second poly gate 120b. The device 105 includes the continuous active areas 110, 111 with the first VT region 140 and the second VT region 142. Accordingly, the first PMOS transistor 130 and the first NMOS transistor 131 have the first VT, while the second PMOS transistor 134 and the second NMOS transistor 135 have the second VT. As noted above, the first and second VTs could be any of a standard VT (SVT), low VT (LVT), ultra low VT (uLVT), high VT (HVT), etc.

In the embodiment of FIG. 9, the conductive via 127 connects the VSS rail 114 to the poly gate 120a of the first PMOS transistor 130. Therefore, the first PMOS transistor 130 is always on. However metal line 162 MD is connected to VDD by a conductive via 128, and the poly gate 120b of the second PMOS transistor 132 is connected to the metal line 164 through the M0 metal layer 160. The second poly gate 132 includes the cut poly 154. As such, the VDD voltage leaks to the drain side of the PMOS transistor 130 from its source. The "leaked" VDD voltage is so referred to as a "soft" VDD connection, which ties off the PMOS transistor 132.

Similarly, FIG. 10 illustrates a device 106 that includes the first and second fins 110, 111 that define the PMOS region 150 and the NMOS region 152. The device 106 includes the first and second power rails 112,114, which are the VDD and VSS power rails, respectively, in the illustrated example. The active areas or fins 110 and 111 extend in the X-axis direction. The plurality of poly gates 120 contact the active area 111 and extend in the Y-axis direction such that the poly gates 120 extend generally perpendicular to the active areas 110, 111. The device 106 has five poly gates 120a-120e and is thus also a five CPP structure.

The PMOS region 150 includes the first PMOS transistor 130 formed by the first active area 110 and the first poly gate 120a, and the second PMOS transistor 132 formed by the first active area 110 and the poly gate 120b. The first NMOS transistor 131 is formed by the active area 111 and the first poly gate 120a, and the second NMOS transistor 133 is formed by the active area 111 and the second poly gate 120b. The device 106 includes the continuous active areas 110, 111 with the first VT region 140 and the second VT region 142. Accordingly, the first PMOS transistor 130 and the first NMOS transistor 131 have the first VT, while the second PMOS transistor 134 and the second NMOS transistor 135 have the second VT. As noted above, the first and second VTs could be any of a standard VT (SVT), low VT (LVT), ultra low VT (uLVT), high VT (HVT), etc.

In the embodiment of FIG. 10, the conductive via 126 connects the VDD rail 112 to the poly gate 120a of the first NMOS transistor 131. Therefore, the first NMOS transistor 131 is always on. The metal line 162 is connected to the VSS rail 114 by a conductive via 129, and the poly gate 120b of the second NMOS transistor 133 is connected to the metal line 164 through the M0 metal layer 160. The second poly gate 120b includes the cut poly 154. As such, the VSS voltage leaks to the drain side of the NMOS transistor 131 from its source. The "leaked" VSS voltage is so referred to as a "soft VSS" connection, which ties off the NMOS transistor 133.

Figure 11:
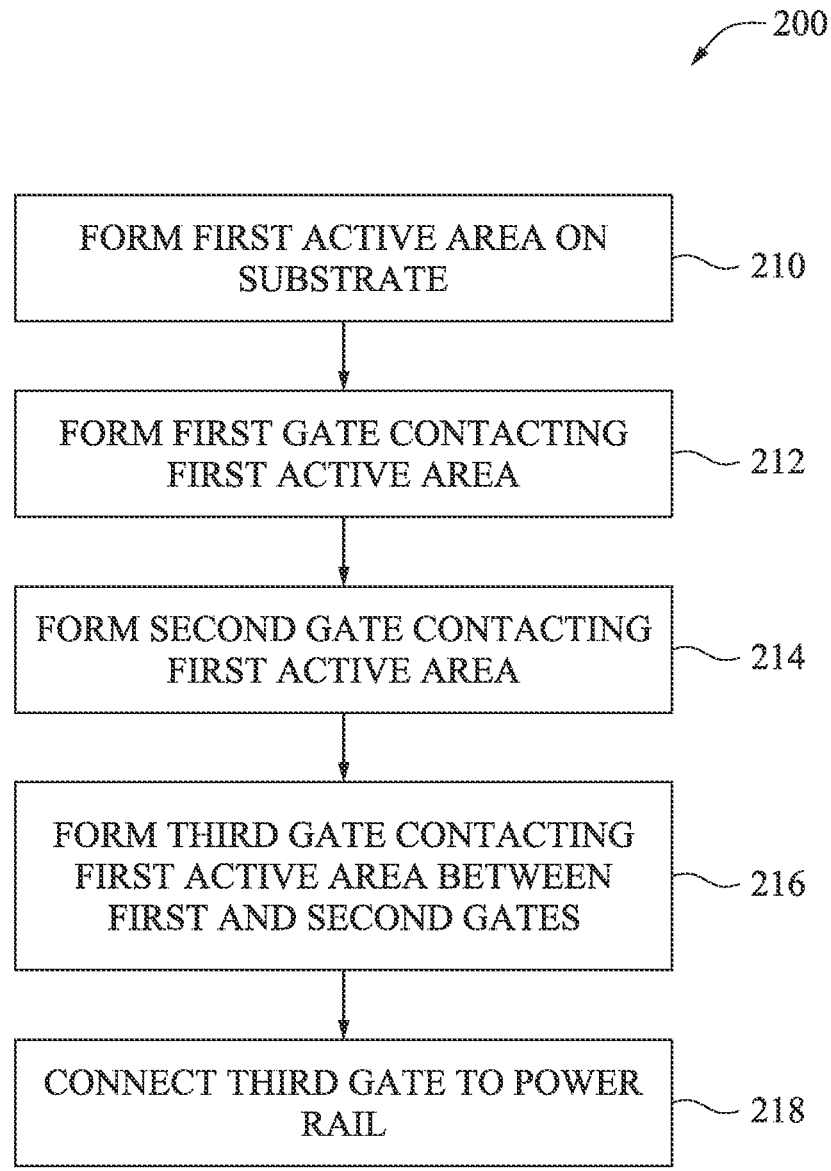
FIG. 11 is a flow diagram illustrating an example of a method in accordance with some embodiments.

FIG. 11 illustrates a method in accordance with disclosed embodiments. The illustrated method 200 provides a tie-off device. More particularly, the method includes forming a first active area on a substrate at step 210. The first active area, such as the fin 110, has a first VT region 140 and a second VT region 142. At step 212, a first gate 120a is formed that contacts the first VT region 140 of the first active area to form a first transistor having a first VT. In some examples, the first transistor may be a PMOS transistor such as the PMOS transistor 130, or an NMOS transistor such as the NMOS transistor 131 shown in FIGS. 4-10. A second gate 120b is formed at step 214 that contacts the second VT region 142 of the first active area 110 to form a second transistor having a second VT that is different than the first VT. In some examples, the second transistor may be a PMOS transistor such as the PMOS transistor 132, or an NMOS transistor such as the NMOS transistor 133 shown in FIGS. 4-10. A third gate 120c is formed at step 216 to contact the first active area 110 between the first gate 120a and the second gate 120b to form a tie-off transistor positioned between the first transistor and the second transistor. In some examples, the tie-off transistor may be a PMOS transistor such as the PMOS tie-off transistor 134, or an NMOS tie-off transistor such as the NMOS tie-off transistor 135 shown in FIGS. 4-10. At step 218, the third gate 120c is connected to a power rail, such as the VDD or VSS power rails, to maintain the tie-off transistor 134 in an off state and thus electrically isolating the first transistor from the second transistor.

In some embodiments, some or all of the method 200 is executed by a processor of a computer. In some embodiments, some or all of the method 200 is executed by a processor 302 of an EDA system 300, discussed below with respect to FIG. 12.

Some or all of the operations of the method 200 are capable of being performed as part of a design procedure performed in a design house, such as the design house 320 discussed below with respect to FIG. 13.

Figure 12:
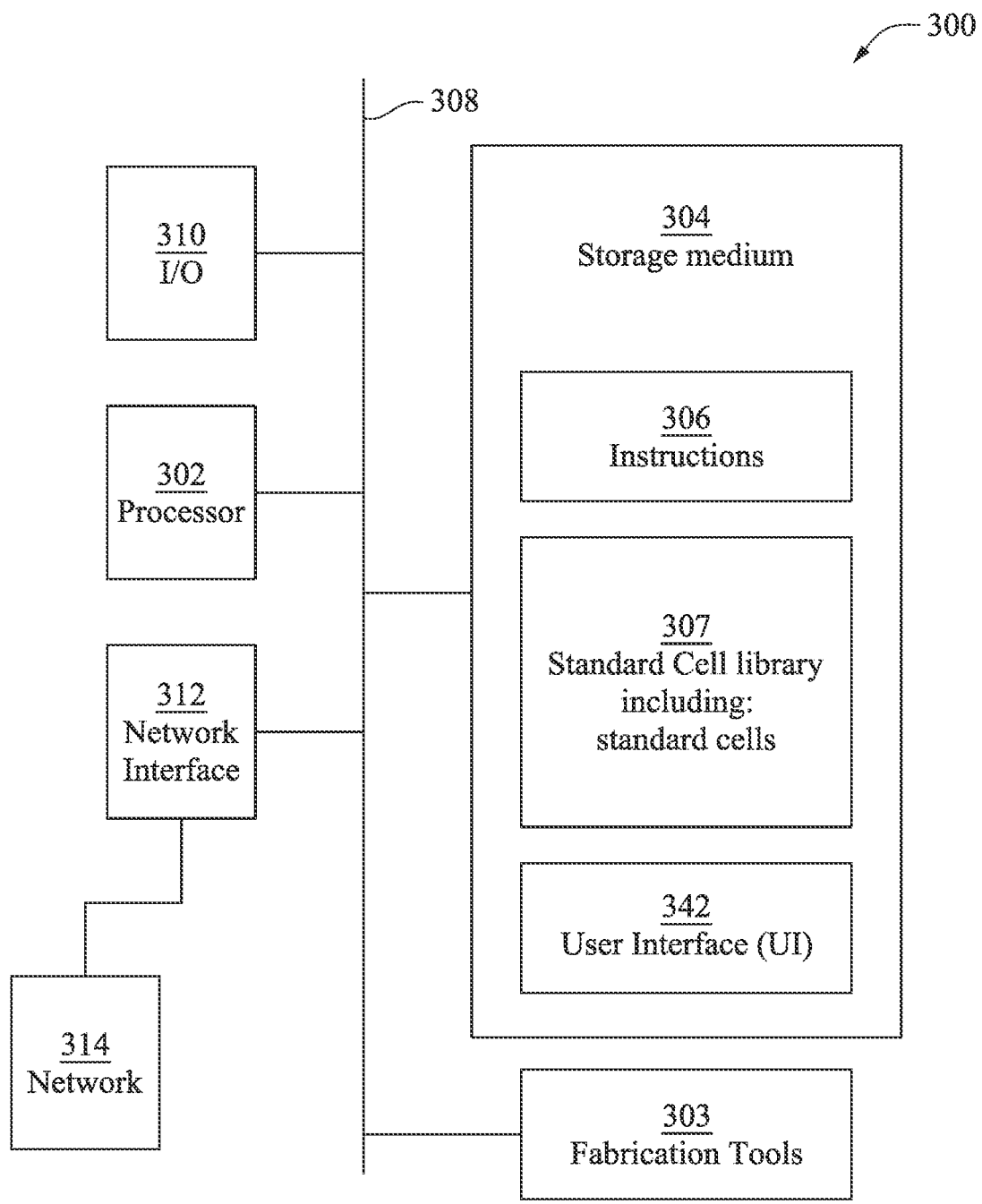
FIG. 12 is a block diagram illustrating aspects of an example of a of an electronic design automation (EDA) system in accordance with some embodiments.

FIG. 12 is a block diagram of an electronic design automation (EDA) system 700, in accordance with some embodiments. In some embodiments, the EDA system 300 includes an automated place and route (APR) system. In some embodiments, the EDA system 300 is a general purpose computing device including a processor 302 and a non-transitory, computer-readable storage medium 304. The computer-readable storage medium 304, may be encoded with, for example, stores, computer program code 306, i.e., a set of executable instructions. Execution of instructions 306 by the processor 302 represents (at least in part) an EDA tool which implements a portion or all of, e.g., the method 200 described above with respect to FIG. 11 (hereinafter, the noted processes and/or methods). Further, fabrication tools 303 may be included for layout and physical implementation of IC devices in accordance with methods disclosed herein such as the method 200 of FIG. 11.

The processor 302 is electrically coupled to the computer-readable storage medium 304 via a bus 308. The processor 302 is also electrically coupled to an I/O interface 310 by the bus 308. A network interface 312 is also electrically connected to the processor 302 via the bus 308. The network interface 312 is connected to a network 314, so that the processor 302 and the computer-readable storage medium 304 are capable of connecting to external elements via the network 314. The processor 302 is configured to execute the computer program code 306 encoded in the computer-readable storage medium 304 in order to cause the system 300 to be usable for performing a portion or all of the noted processes and/or methods. In one or more embodiments, the processor 302 is a central processing unit (CPU), a multi-processor, a distributed processing system, an application specific integrated circuit (ASIC), and/or a suitable processing unit.

In one or more embodiments, the computer-readable storage medium 304 is an electronic, magnetic, optical, electromagnetic, infrared, and/or a semiconductor system (or apparatus or device). For example, the computer-readable storage medium 304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer-readable storage medium 304 includes a compact disk-read only memory (CD-ROM), a compact disk-read/write (CD-R/W), and/or a digital video disc (DVD).

In one or more embodiments, the computer-readable storage medium 304 stores computer program code 306 configured to cause the system 300 to be usable for performing a portion or all of the noted processes and/or methods. In one or more embodiments, the computer-readable storage medium 304 also stores information which facilitates performing a portion or all of the noted processes and/or methods. In one or more embodiments, the computer-readable storage medium 304 stores a library 307 of standard cells including the various IC devices disclosed herein.

The EDA system 300 includes an I/O interface 310. The I/O interface 310 is coupled to external circuitry. In one or more embodiments, the I/O interface 310 includes a keyboard, keypad, mouse, trackball, trackpad, touchscreen, and/or cursor direction keys for communicating information and commands to the processor 302.

The EDA system 300 also includes a network interface 312 coupled to the processor 302. The network interface 312 allows the system 300 to communicate with the network 314, to which one or more other computer systems are connected. The network interface 312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 300.

The system 300 is configured to receive information through an I/O interface 310. The information received through the I/O interface 310 includes one or more of instructions, data, design rules, libraries of standard cells, and/or other parameters for processing by processor 302. The information is transferred to the processor 302 via the bus 308. The EDA system 300 is configured to receive information related to a UI through the I/O interface 310. The information is stored in the computer-readable medium 304 as a user interface (UI) 342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by the EDA system 300. In some embodiments, a layout diagram which includes standard cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the EDA system 300 may include fabrication tools 303 for implementing the processes and/or methods stored in the storage medium 304. For instance, a synthesis may be performed on a design in which the behavior and/or functions desired from the design are transformed to a functionally equivalent logic gate-level circuit description by matching the design to standard cells selected from the standard cell library 307. The synthesis results in a functionally equivalent logic gate-level circuit description, such as a gate-level netlist. Based on the gate-level netlist, a photolithographic mask may be generated that is used to fabricate the integrated circuit by the fabrication tools 303. Further aspects of device fabrication are disclosed in conjunction with FIG. 13, which is a block diagram of IC manufacturing system 301, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using the manufacturing system 301.

Figure 13:
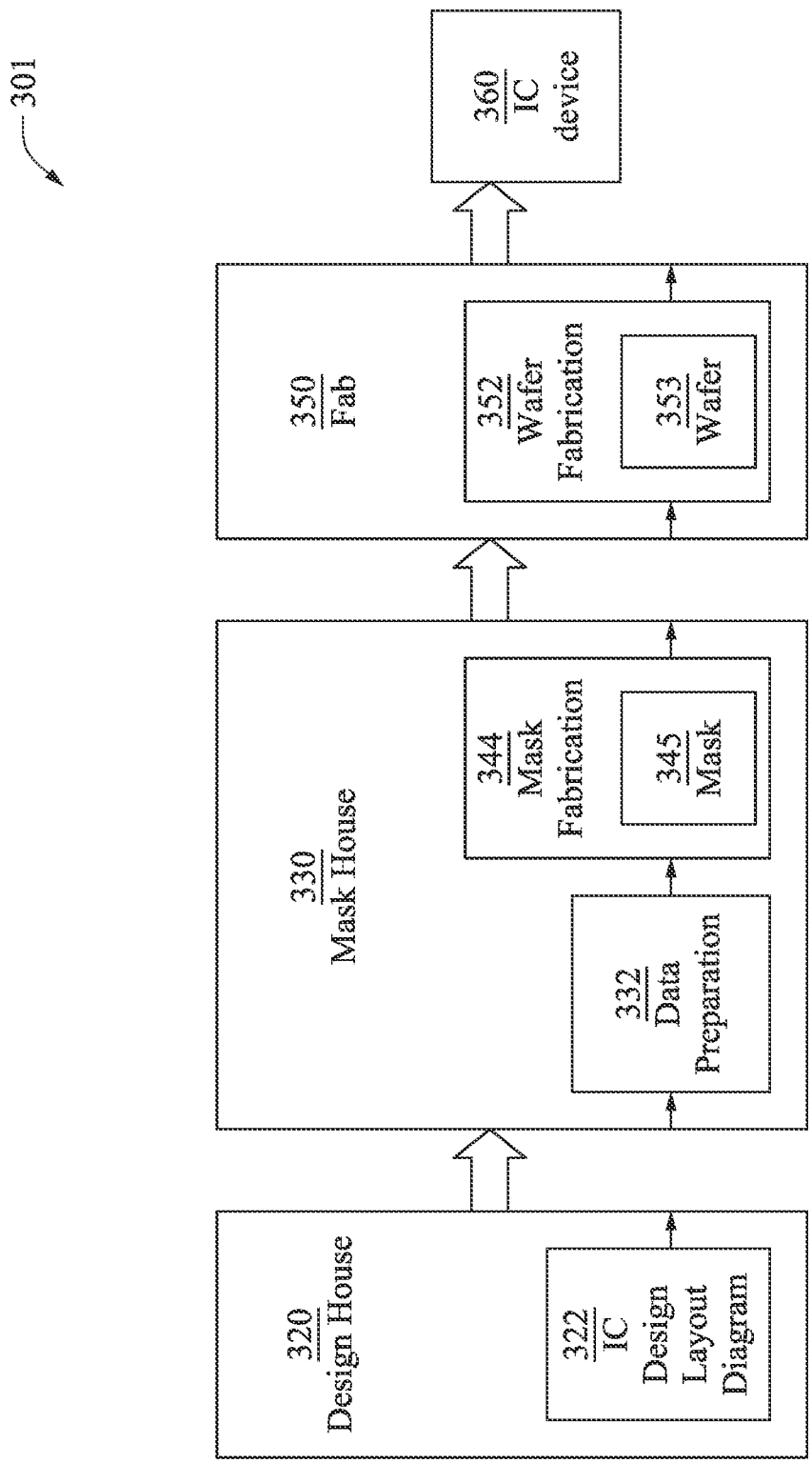
FIG. 13 is a block diagram illustrating aspects of an example of an IC manufacturing system and manufacturing flow in accordance with some embodiments.

In FIG. 13, the IC manufacturing system 301 includes entities, such as a design house 320, a mask house 330, and an IC manufacturer/fabricator ("fab") 350, that interact with one another in the design, development, and manufacturing cycles and/or services related to manufacturing an IC device 360, such as the devices 100-106 disclosed herein. The entities in the system 301 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 320, mask house 330, and IC fab 350 is owned by a single larger company. In some embodiments, two or more of design house 320, mask house 330, and IC fab 350 coexist in a common facility and use common resources.

The design house (or design team) 320 generates an IC design layout diagram 322. The IC design layout diagram 322 includes various geometrical patterns, or IC layout diagrams designed for an IC device 360, e.g., an IC device including one or more of the disclosed IC structures 100-106, discussed above. The geometrical patterns correspond to patterns of metal, oxide, or semiconductor layers that make up the various components of IC device 360 to be fabricated. The various layers combine to form various IC features. For example, a portion of the IC design layout diagram 322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 320 implements a design procedure to form a IC design layout diagram 322. The design procedure includes one or more of logic design, physical design or place and route. The IC design layout diagram 322 is presented in one or more data files having information of the geometrical patterns. For example, IC design layout diagram 322 can be expressed in a GDSII file format or DFII file format.

The mask house 330 includes a data preparation 332 and a mask fabrication 344. The mask house 330 uses the IC design layout diagram 322 to manufacture one or more masks 345 to be used for fabricating the various layers of the IC device 360 according to the IC design layout diagram 322. The mask house 330 performs mask data preparation 332, where the IC design layout diagram 322 is translated into a representative data file ("RDF"). The mask data preparation 332 provides the RDF to the mask fabrication 344. The mask fabrication 344 includes a mask writer. A mask writer converts the RDF to an image on a substrate, such as a mask (reticle) 345 or a semiconductor wafer 353. The design layout diagram 322 is manipulated by the mask data preparation 332 to comply with particular characteristics of the mask writer and/or requirements of the IC fab 350. In FIG. 13, the mask data preparation 332 and the mask fabrication 344 are illustrated as separate elements. In some embodiments, the mask data preparation 332 and the mask fabrication 344 can be collectively referred to as a mask data preparation.

In some embodiments, the mask data preparation 332 includes an optical proximity correction (OPC) which uses lithography enhancement techniques to compensate for image errors, such as those that can arise from diffraction, interference, other process effects and the like. The OPC adjusts the IC design layout diagram 322. In some embodiments, the mask data preparation 332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 332 includes a mask rule checker (MRC) that checks the IC design layout diagram 322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 322 to compensate for limitations during the mask fabrication 344, which may undo part of the modifications performed by OPC in order to meet mask creation rules.

In some embodiments, the mask data preparation 332 includes lithography process checking (LPC) that simulates processing that will be implemented by the IC fab 350 to fabricate the IC device 360. LPC simulates this processing based on the IC design layout diagram 322 to create a simulated manufactured device, such as the IC device 360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 322.

It should be understood that the above description of mask data preparation 332 has been simplified for the purposes of clarity. In some embodiments, data preparation 332 includes additional features such as a logic operation (LOP) to modify the IC design layout diagram 322 according to manufacturing rules. Additionally, the processes applied to the IC design layout diagram 322 during data preparation 332 may be executed in a variety of different orders.

After the mask data preparation 332 and during the mask fabrication 344, a mask 345 or a group of masks 345 are fabricated based on the modified IC design layout diagram 322. In some embodiments, the mask fabrication 344 includes performing one or more lithographic exposures based on the IC design layout diagram 322. In some embodiments, an electron-beam (e-beam) or a mechanism of multiple e-beams is used to form a pattern on a mask (photomask or reticle) 345 based on the modified IC design layout diagram 322. The mask 345 can be formed in various technologies. In some embodiments, the mask 345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask 345 includes a transparent substrate (e.g., fused quartz) and an opaque material (e.g., chromium) coated in the opaque regions of the binary mask. In another example, the mask 345 is formed using a phase shift technology. In a phase shift mask (PSM) version of the mask 345, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 344 is used in a variety of processes. For example, such a mask(s) is used in an ion implantation process to form various doped regions in the semiconductor wafer 353, in an etching process to form various etching regions in the semiconductor wafer 353, and/or in other suitable processes.

The IC fab 350 includes wafer fabrication 352. The IC fab 350 is an IC fabrication business that includes one or more manufacturing facilities for the fabrication of a variety of different IC products. In some embodiments, the IC Fab 350 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 350 uses mask(s) 345 fabricated by the mask house 330 to fabricate the IC device 360. Thus, the IC fab 350 at least indirectly uses the IC design layout diagram 322 to fabricate the IC device 360. In some embodiments, the semiconductor wafer 353 is fabricated by the IC fab 350 using mask(s) 345 to form the IC device 360. In some embodiments, the IC fabrication includes performing one or more lithographic exposures based at least indirectly on the IC design layout diagram 322. The Semiconductor wafer 353 includes a silicon substrate or other proper substrate having material layers formed thereon. The semiconductor wafer 353 further includes one or more of various doped regions, dielectric features, multilevel interconnects, and the like (formed at subsequent manufacturing steps).

Thus, disclosed embodiments include an integrated circuit device that includes a first power rail and a first active area extending in a first direction. A plurality of gates contact the first active area and extend in a second direction perpendicular to the first direction. A first transistor includes the first active area and a first one of the gates. The first transistor has a first VT. A second transistor includes the first active area and a second one of the gates, and the second transistor has a second VT different than the first VT. A tie-off transistor is positioned between the first transistor and the second transistor. The tie-off transistor includes the first active area and a third one of the gates, wherein the third gate is connected to the first power rail.

In accordance with other disclosed embodiments, a semiconductor device includes a first power rail and a second power rail. A first PMOS transistor includes a first fin extending in a first direction and a first gate. The first PMOS transistor has a first VT, and the first gate extends in a second direction perpendicular to the first direction. A second PMOS transistor includes the first fin and a second gate that extends in the second direction. The second PMOS transistor has a second VT different than the first VT. The second gate is connected to the first power rail. A second fin extends in the first direction. A first NMOS transistor includes the second fin and the first gate. The first NMOS transistor has the first VT. A second NMOS transistor includes the second fin and the second gate. The second NMOS transistor has the second VT. The second gate is connected to the second power rail.

In accordance with still further embodiments, a method includes forming a first active area on a substrate, where the first active area has a first VT region and a second VT region. A first gate is formed that contacts the first VT region of the first active area to form a first transistor having a first VT. A second gate is formed to contact the second VT region of the first active area to form a second transistor having a second VT that is different than the first VT. A third gate is formed to contact the first active area between the first gate and the second gate to form a tie-off transistor positioned between the first transistor and the second transistor. The third gate is connected to a power rail to maintain the tie-off transistor in an off state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a first power rail;
   a first active area extending in a first direction, the first active area including a first region defining a first threshold voltage (VT) and a second region defining a second VT different than the first VT, the first and second regions abutting one another to define a boundary therebetween;
   a plurality of gates contacting the first active area and extending in a second direction perpendicular to the first direction;
   a first transistor including the first region of the first active area and a first one of the gates, the first transistor having the first VT;
   a second transistor including the second region of the first active area and a second one of the gates, the second transistor having the second VT; and
   a tie-off transistor positioned at the boundary of the first region and the second region such that the first transistor is on a first side of the boundary in the first direction and the second transistor is on a second side of the boundary in the first direction, the tie-off transistor including the first active area and a third one of the gates, wherein the third gate is positioned directly over the boundary and is connected to the first power rail.

2. The integrated circuit device of claim 1, wherein the third gate is connected to the first power rail by a first conductive via.

3. The integrated circuit device of claim 1, wherein the first active area includes a fin.

4. The integrated circuit device of claim 1, wherein the tie-off transistor is a PMOS transistor, and where the first power rail is a VDD power rail.

5. The integrated circuit device of claim 1, wherein the tie-off transistor is an NMOS transistor, and where the first power rail is a VSS power rail.

6. The integrated circuit device of claim 4, wherein the first and second transistors are PMOS transistors.

7. The integrated circuit device of claim 5, wherein the first and second transistors are NMOS transistors.

8. The integrated circuit device of claim 6, wherein the plurality of gates are poly gates, the integrated circuit device further comprising:
   a VSS power rail;
   a second active area extending in the first direction, wherein the plurality of poly gates contact the second active area;
   a first NMOS transistor including the second active area and the first poly gate, the first NMOS transistor having the first VT;
   a second NMOS transistor including the second active area and the second poly gate, the second NMOS transistor having the second VT; and
   an NMOS tie-off transistor positioned between the first NMOS transistor and the second NMOS transistor, the NMOS tie-off transistor including the first active area and the third poly gate, wherein the third poly gate is connected to the VSS power rail, and wherein the third poly gate includes a cut poly between the first and second active areas.

9. The integrated circuit device of claim 8, wherein the third poly gate is connected to the VSS power rail by a second conductive via.

10. The integrated circuit device of claim 9, wherein the third poly gate is connected to the VSS power rail by a metal layer and a third conductive via.

11. The integrated circuit device of claim 1, further comprising:
- a first conductive line extending in the first direction;
- a first conductive via connecting the third gate to the first conductive line;
- a second conductive line extending in the second direction;
- a second conductive via connecting the first conductive line to the second conductive line; and
- a third conductive via connecting to second conductive line to the first power rail.

12. The integrated circuit device of claim 1, wherein the plurality of gates further comprises:
- a first dummy structure situated at a first edge of the active area in the first direction; and
- a second dummy structure situated at a second edge of the active area opposite the first edge in the first direction.

13. An integrated circuit device, comprising:
- a first power rail;
- a second power rail;
- a first active area extending in a first direction, the first active area including a first region defining a first threshold voltage (VT) and a second region defining a second VT different than the first VT, wherein the first and second regions abut one another to define a first boundary therebetween such that the first and second regions are on opposite sides of the first boundary in the first direction;
- a first PMOS transistor including the first region of the first active area and a first gate, the first PMOS transistor having the first VT, the first gate extending in a second direction perpendicular to the first direction;
- a second PMOS transistor including the second region of the first active area and a second gate, the second PMOS transistor having the second VT, the second gate extending in the second direction;
- a tie-off PMOS transistor including the first and second regions of the first active area and a third gate extending in the second direction directly over the first boundary such that the first PMOS transistor is on a first side of the boundary in the first direction and the second PMOS transistor is on a second side of the boundary in the first direction, and wherein the third gate is connected to the first power rail;
- a second active area extending in the first direction, the second active area including a third region defining the first VT and a fourth region defining the second VT, wherein the third and fourth regions abut one another to define a second boundary therebetween such that the third and fourth regions are on opposite sides of the second boundary in the first direction, and wherein the first and second boundaries align in the second direction;
- a first NMOS transistor including the third region of the second active area and the first gate, the first NMOS transistor having the first VT;
- a second NMOS transistor including the fourth region of the second active area and the second gate, the second NMOS transistor having the second VT; and
- a tie-off NMOS transistor including the third and fourth regions of the second active area and the third gate extending in the second direction directly over the second boundary such that the first NMOS transistor is on a first side of the boundary in the first direction and the second NMOS transistor is on a second side of the boundary in the first direction, and wherein the third gate is connected to the second power rail.

14. The integrated circuit device of claim 13, wherein the first gate is connected to the second power rail, and wherein the third gate is connected to the first power rail through the first PMOS transistor.

15. The integrated circuit device of claim 13, wherein the first gate is connected to the first power rail, and wherein the third gate is connected to the second power rail through the first NMOS transistor.

16. The integrated circuit device of claim 13, wherein the first, second and third gates comprise respective first, second and third poly gates, and wherein the third poly gate includes a cut poly between the first and second active areas, and wherein the third poly gate is directly connected to the first power rail.

17. A method, comprising:
- forming a first active area on a substrate extending in a first direction, the first active area including a first threshold voltage (VT) region defining a first VT and a second VT region defining a second VT different than the first VT, the first and second regions abutting one another to define a boundary therebetween;
- forming a plurality of gates contacting the first active area and extending in a second direction perpendicular to the first direction;
- forming a first transistor including the first VT region of the first active area and a first one of the gates, the first transistor having the first VT;
- forming a second transistor including the second VT region of the first active area and a second one of the gates, the second transistor having the second VT;
- forming a tie-off transistor positioned at the boundary of the first VT region and the second VT region such that the first transistor is on a first side of the boundary in the first direction and the second transistor is on a second side of the boundary in the first direction, the tie-off transistor including the first active area and a third one of the gates, where in the third gate is positioned directly over the boundary in the second direction; and
- connecting the third gate to a power rail to maintain the tie-off transistor in an off state.

18. The method of claim 17, wherein the tie-off transistor is a PMOS transistor and wherein connecting the third gate to the power rail to maintain the tie-off transistor in the off state includes connecting the third gate to a VDD power rail.

19. The method of claim 18, wherein connecting the third gate to the VDD power rail includes providing a conductive via extending between the third gate and the VDD power rail.

20. The method of claim 19, wherein the first and second transistors and the tie-off transistor are PMOS transistors, the method further comprising:
- forming a second active area on the substrate, the second active area including the first VT region and the second VT region;
- forming the first gate to further contact second active area to form a first NMOS transistor having the first VT;
- forming the second gate to further contact the second active area to form a second NMOS transistor having the second VT;

forming the third gate to further contact the second active area to form an NMOS tie-off transistor positioned between the first NMOS transistor and the second NMOS transistor; and connecting the third gate to a second power rail to maintain the NMOS tie-off transistor in an off state.

\* \* \* \* \*